United States Patent
Chen et al.

(10) Patent No.: US 11,349,017 B2
(45) Date of Patent: May 31, 2022

(54) BIDIRECTIONAL ELECTROSTATIC DISCHARGE (ESD) PROTECTION DEVICE

(71) Applicant: AMAZING MICROELECTRONIC CORP., New Taipei (TW)

(72) Inventors: Chih-Wei Chen, Taoyuan (TW); Kun-Hsien Lin, Hsinchu (TW)

(73) Assignee: Amazing Microelectronic Corp., New Taipei (TW)

( * ) Notice: Subject to any disclaimer, the term of this patent is extended or adjusted under 35 U.S.C. 154(b) by 183 days.

(21) Appl. No.: 16/909,142

(22) Filed: Jun. 23, 2020

(65) Prior Publication Data

US 2021/0399117 A1    Dec. 23, 2021

(51) Int. Cl.
*H01L 29/06* (2006.01)
*H01L 29/732* (2006.01)
*H01L 29/08* (2006.01)
*H01L 29/10* (2006.01)

(52) U.S. Cl.
CPC ........ *H01L 29/732* (2013.01); *H01L 29/0804* (2013.01); *H01L 29/0821* (2013.01); *H01L 29/1004* (2013.01)

(58) Field of Classification Search
CPC ............... H01L 29/732; H01L 29/0804; H01L 29/0821; H01L 29/1004
See application file for complete search history.

(56) References Cited

U.S. PATENT DOCUMENTS

| 5,190,884 A | 3/1993 | Giannella |
| 5,212,618 A | 5/1993 | O'Neill et al. |
| 5,455,447 A | 10/1995 | Hutter et al. |
| 5,493,134 A | 2/1996 | Mehrotra et al. |
| 5,757,034 A * | 5/1998 | Ajit ............. H01L 29/7455 257/132 |
| 6,507,090 B1 | 1/2003 | Hu et al. |
| 6,569,730 B2 | 5/2003 | Tsai et al. |

(Continued)

FOREIGN PATENT DOCUMENTS

| CN | 100463175 C | 2/2009 |
| TW | M276321 U | 9/2005 |

(Continued)

*Primary Examiner* — Khaja Ahmad

(74) *Attorney, Agent, or Firm* — Rosenberg, Klein & Lee

(57) ABSTRACT

A bidirectional electrostatic discharge protection device and a method for fabricating the same is disclosed. The protection device includes a heavily-doped semiconductor substrate, a first semiconductor epitaxial layer, a second semiconductor epitaxial layer, a heavily-doped area, and a lightly-doped area. The substrate, the heavily-doped area, and the lightly-doped area have a first conductivity type and the epitaxial layers have a second conductivity type. The first semiconductor epitaxial layer and the second semiconductor epitaxial layer are sequentially formed on the substrate, and the heavily-doped area and the lightly-doped area are formed in the second semiconductor epitaxial layer. The lightly-doped area covers the corner of the heavily-doped area, and the breakdown voltage of a junction between the heavily-doped semiconductor substrate and the first semiconductor epitaxial layer corresponds to the breakdown voltage of a junction between the second semiconductor epitaxial layer and the heavily-doped area.

13 Claims, 25 Drawing Sheets

(56) References Cited

U.S. PATENT DOCUMENTS

| | | |
|---|---|---|
| 8,217,421 B2 | 7/2012 | Chen et al. |
| 8,461,644 B2 | 6/2013 | Bobde |
| 8,859,361 B1 | 10/2014 | Bobde |
| 9,379,203 B2 * | 6/2016 | Veeramma .......... H01L 29/0684 |
| 2007/0063274 A1 * | 3/2007 | Kanda ................. H01L 29/7322 |
| | | 257/E21.375 |
| 2009/0057716 A1 * | 3/2009 | Rodrigues ............... H01L 29/87 |
| | | 257/E29.337 |
| 2012/0217541 A1 * | 8/2012 | Hsieh .................. H01L 29/8611 |
| | | 257/140 |
| 2020/0266303 A1 * | 8/2020 | Sai ...................... H01L 27/0248 |

FOREIGN PATENT DOCUMENTS

| | | |
|---|---|---|
| TW | 201123400 A1 | 7/2011 |
| TW | 201824511 A | 7/2018 |

* cited by examiner

US 11,349,017 B2

BIDIRECTIONAL ELECTROSTATIC DISCHARGE (ESD) PROTECTION DEVICE

BACKGROUND OF THE INVENTION

Field of the Invention

The present invention relates to the electrostatic discharge (ESD) technology, particularly to a bidirectional electrostatic discharge (ESD) protection device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

The working principle of ESD protection device is shown in FIG. 1. In FIG. 1, the ESD protection device 8 is connected in parallel with a protected circuit 9 on the IC chip. The ESD protection device 8 would be triggered immediately when the ESD event occurs. In that way, the ESD protection device 8 can provide a superiorly low resistance path for discharging the transient ESD current, so that the energy of the ESD transient current can be bypassed by the ESD protection device 8. For the purpose of reducing the size and surface areas occupied by the ESD protection device 8, a vertical transient voltage suppressor is implemented in the U.S. Pat. No. 8,217,421 B2, the U.S. Pat. No. 5,190,884, and the U.S. Pat. No. 5,455,447. These patents disclosed PNP bipolar junction transistors. However, these PNP bipolar junction transistors are unidirectional PNP devices, not bidirectional PNP devices.

To overcome the abovementioned problems, the present invention provides a bidirectional electrostatic discharge (ESD) protection device, so as to solve the afore-mentioned problems of the prior art.

SUMMARY OF THE INVENTION

The present invention provides a bidirectional electrostatic discharge (ESD) protection device, which suppress the current crowding effect and improve the ESD robustness.

The present invention provides a bidirectional electrostatic discharge (ESD) protection device, which comprises a heavily-doped semiconductor substrate, a first semiconductor epitaxial layer, a second semiconductor epitaxial layer, a heavily-doped area, and a lightly-doped area, wherein the substrate, the heavily-doped area, and the lightly-doped area have a first conductivity type and the first semiconductor epitaxial layer and the second semiconductor epitaxial layer have a second conductivity type. The first semiconductor epitaxial layer and the second semiconductor epitaxial layer are sequentially formed on the heavily-doped semiconductor substrate, and the heavily-doped area and the lightly-doped area are formed in the second semiconductor epitaxial layer. The lightly-doped area surrounds the heavily-doped area and covers the corner of the heavily-doped area.

In an embodiment of the present invention, the breakdown voltage of a junction between the heavily-doped semiconductor substrate and the first semiconductor epitaxial layer corresponds to the breakdown voltage of a junction between the second semiconductor epitaxial layer and the heavily-doped area.

In an embodiment of the present invention, the first conductivity type is an N type and the second conductivity type is a P type.

In an embodiment of the present invention, the first conductivity type is a P type and the second conductivity type is an N type.

In an embodiment of the present invention, the absolute value of the breakdown voltage of the junction between the heavily-doped semiconductor substrate and the first semiconductor epitaxial layer is equal to the absolute value of the breakdown voltage of the junction between the second semiconductor epitaxial layer and the heavily-doped area In an embodiment of the present invention, the doping concentration of the first semiconductor epitaxial layer is higher than the doping concentration of the second semiconductor epitaxial layer because the thermal budget of the junction between the heavily-doped semiconductor substrate and the first semiconductor epitaxial layer is higher than the thermal budget of the junction between the second semiconductor epitaxial layer and the heavily-doped area.

In an embodiment of the present invention, the bidirectional electrostatic discharge protection device further comprises an isolation structure formed in the heavily-doped semiconductor substrate, the first semiconductor epitaxial layer, and the second semiconductor epitaxial layer, and the isolation structure surrounds the heavily-doped area and the lightly-doped area.

In an embodiment of the present invention, the bidirectional electrostatic discharge protection device further comprises an isolation structure formed in the heavily-doped semiconductor substrate, the first semiconductor epitaxial layer, and the second semiconductor epitaxial layer, the isolation structure surrounds the heavily-doped area, and the lightly-doped area surrounds the isolation structure.

In an embodiment of the present invention, the bidirectional electrostatic discharge protection device further comprises a heavily-doped buried layer formed between the first semiconductor epitaxial layer and the second semiconductor epitaxial layer, and the heavily-doped buried layer has the second conductivity type.

In an embodiment of the present invention, the depth of the isolation structure is at least deeper than the total thickness of the first semiconductor epitaxial layer and the second semiconductor epitaxial layer.

In an embodiment of the present invention, the bottom of the lightly-doped area is equal to or deeper than the bottom of the heavily-doped area.

In an embodiment of the present invention, the heavily-doped semiconductor substrate is coupled to a first conductive pin, the heavily-doped area is coupled to a second conductive pin, and the first semiconductor epitaxial layer and the second semiconductor epitaxial layer are floating.

To sum up, the embodiments form the lightly-doped area to cover the corner of the heavily-doped area, thereby suppressing the current crowding effect and improving the ESD robustness.

Below, the embodiments are described in detail in cooperation with the drawings to make easily understood the technical contents, characteristics and accomplishments of the present invention.

DETAILED DESCRIPTION OF THE INVENTION

Figure 1:
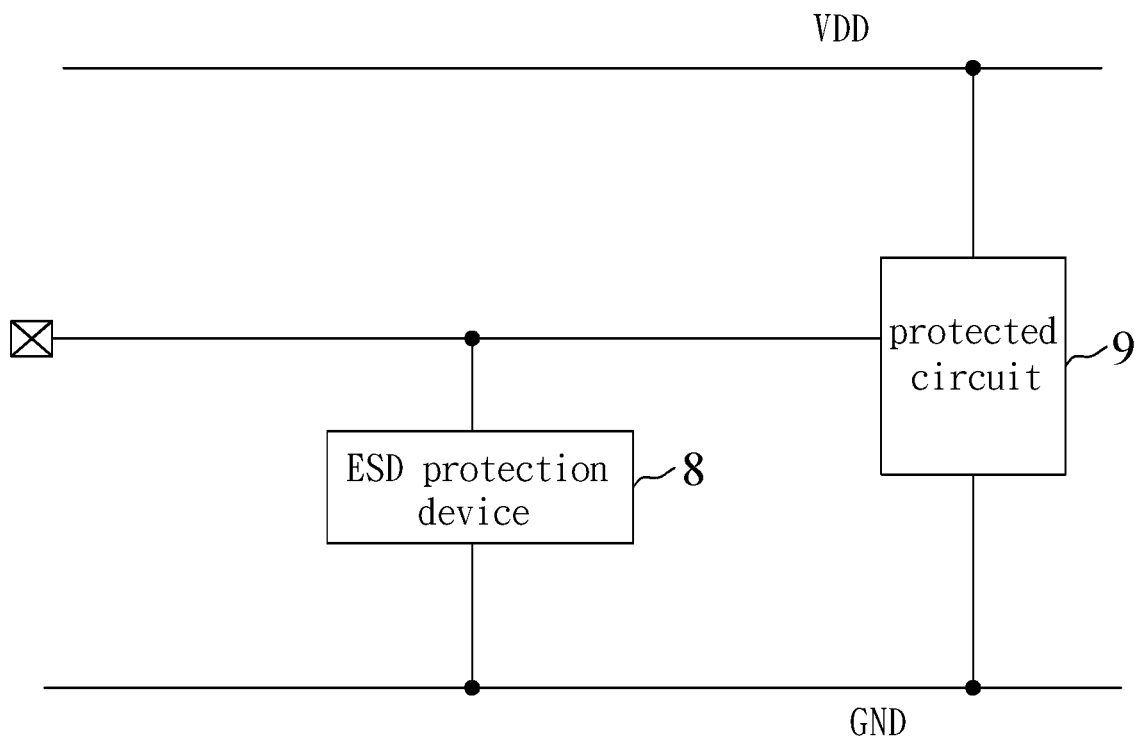
FIG. 1 is a schematic diagram illustrating an ESD protection device connected with a protected circuit on an IC chip in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Figure 2:
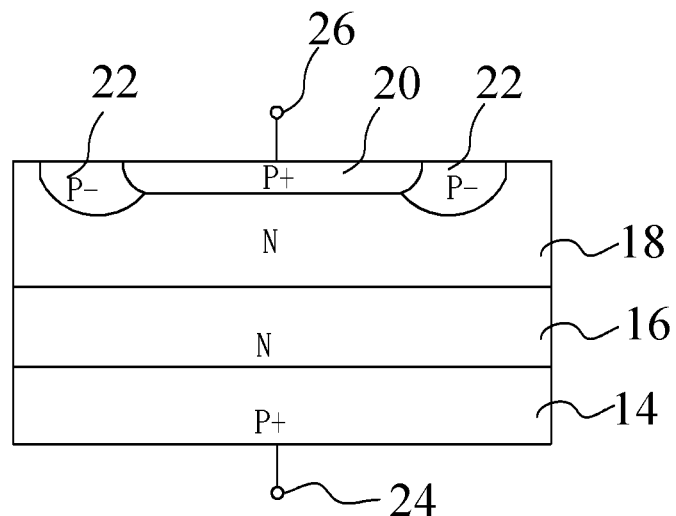
FIG. 2 is a cross-sectional view of a bidirectional electrostatic discharge (ESD) protection device according to the first embodiment of the present invention.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means FIG. 2 is a cross-sectional view of a bidirectional electrostatic discharge (ESD) protection device according to the first embodiment of the present invention. Referring to FIG. 2, the first embodiment of the bidirectional ESD protection device 10 comprises a heavily-doped semiconductor substrate 14, a first semiconductor epitaxial layer 16, a second semiconductor epitaxial layer 18, a heavily-doped area 20, and a lightly-doped area 22. The heavily-doped semiconductor substrate 14, the heavily-doped area 20, and the lightly-doped area 22 have a first conductivity type, and the first semiconductor epitaxial layer 16 and the second semiconductor epitaxial layer 18 have a second conductivity type. In the first embodiment, the first conductivity type is a P type and the second conductivity type is an N type. The doping concentration of the lightly-doped area 22 is less than that of the heavily-doped area 20.

The first semiconductor epitaxial layer 16 is formed on the heavily-doped semiconductor substrate 14. The second semiconductor epitaxial layer 18 is formed on the first semiconductor epitaxial layer 16. The doping concentration of the first semiconductor epitaxial layer 16 is different from the doping concentration of the second semiconductor epitaxial layer 18. The heavily-doped area 20 is formed in the second semiconductor epitaxial layer 18. The lightly-doped area 22 is formed in the second semiconductor epitaxial layer 18. The lightly-doped area 22 surrounds the heavily-doped area 20 and covers the corner of the heavily-doped area 20 in order to suppress the current crowding effect and the breakdown event at the corner of the heavily-doped area 20 then the ESD robustness is improved. Alternatively or in combination, the lightly-doped area 22 contacts the sidewall of the heavily-doped area 20. If the corner of the heavily-doped area 20 has a right angle, the bottom of the lightly-doped area 22 is equal to or deeper than the bottom of the heavily-doped area 20.

Figure 3:
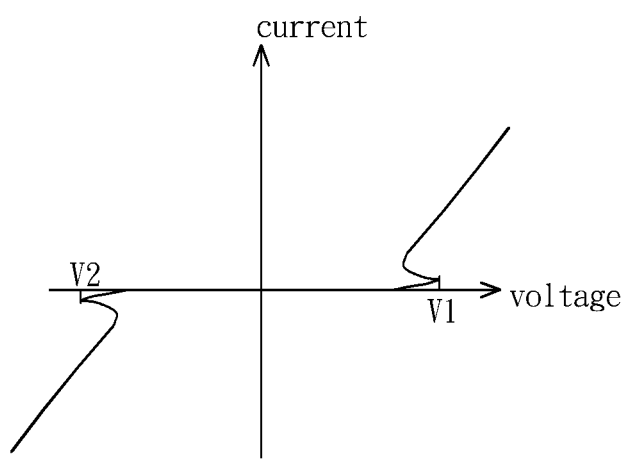
FIG. 3 is an I-V curve of a bidirectional ESD protection device according to an embodiment of the present invention.

FIG. 3 is an I-V curve of a bidirectional ESD protection device according to an embodiment of the present invention. Referring to FIG. 2 and FIG. 3, the heavily-doped semiconductor substrate 14, the first semiconductor epitaxial layer 16, the second semiconductor epitaxial layer 18, the heavily-doped area 20, and the lightly-doped area 22 form a vertical PNP bipolar junction transistor for reducing the size and surface areas occupied by the bidirectional ESD protection device 10. In some embodiment of the present invention, when ions are doped into either the first semiconductor epitaxial layer 16 or the second semiconductor epitaxial layer 18, the other's doping concentration is influenced. Thus, the breakdown voltage V1 of a junction between the heavily-doped semiconductor substrate 14 and the first semiconductor epitaxial layer 16 corresponds to the breakdown voltage V2 of a junction between the second semiconductor epitaxial layer 18 and the heavily-doped area 20. The breakdown voltages V1 and V2 are adaptable according to requirements. The breakdown voltages V1 and V2 depend on the doping concentration of the heavily-doped semiconductor substrate 14, the first semiconductor epitaxial layer 16, the second semiconductor epitaxial layer 18, and the heavily-doped area 20. For example, in order to make the absolute value of the breakdown voltage V1 of the junction between the heavily-doped semiconductor substrate 14 and the first semiconductor epitaxial layer 16 be equal to the absolute value of the breakdown voltage V2 of the junction between the second semiconductor epitaxial layer 18 and the heavily-doped area 20, the doping concentration of the first semiconductor epitaxial layer 16 is higher than the doping concentration of the second semiconductor epitaxial layer 18 because the thermal budget of the junction between the heavily-doped semiconductor substrate 14 and the first semiconductor epitaxial layer 16 is higher than the thermal budget of the junction between the second semiconductor epitaxial layer 18 and the heavily-doped area 20.

When applying ESD energy to the bidirectional electrostatic discharge protection device 10, the heavily-doped semiconductor substrate 14 is coupled to a first conductive pin 24, the heavily-doped area 20 is coupled to a second conductive pin 26, and the first semiconductor epitaxial layer 16 and the second semiconductor epitaxial layer 18 are floating. When the first conductive pin 24 receives the positive ESD energy and the second conductive pin 26 receives grounding voltage, the breakdown event occurs at the junction between the second semiconductor epitaxial layer 18 and the heavily-doped area 20 and the ESD current flows from the first conductive pin 24 to the second conductive pin 26 through the heavily-doped semiconductor substrate 14, the first semiconductor epitaxial layer 16, the second semiconductor epitaxial layer 18, and the heavily-doped area 20. When the first conductive pin 24 receives the negative ESD energy and the second conductive pin 26 receives grounding voltage, the breakdown event occurs at the junction between the heavily-doped semiconductor substrate 14 and the first semiconductor epitaxial layer 16 and the ESD current flows from the second conductive pin 26 to the first conductive pin 24 through the heavily-doped area 20, the second semiconductor epitaxial layer 18, the first semiconductor epitaxial layer 16, and the heavily-doped semiconductor substrate 14.

Figure 4A:
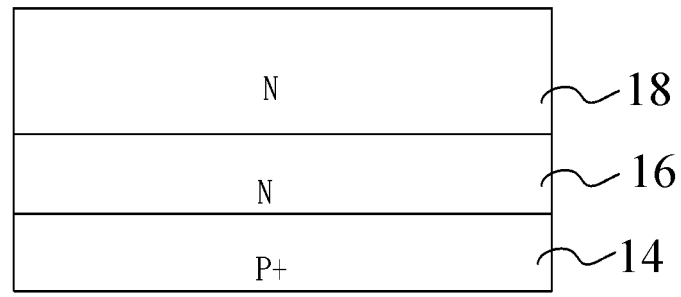
FIGS. 4(a)-4(b) are cross-sectional views of the steps for fabricating a bidirectional ESD protection device according to the first embodiment of the present invention.
Figure 4B:
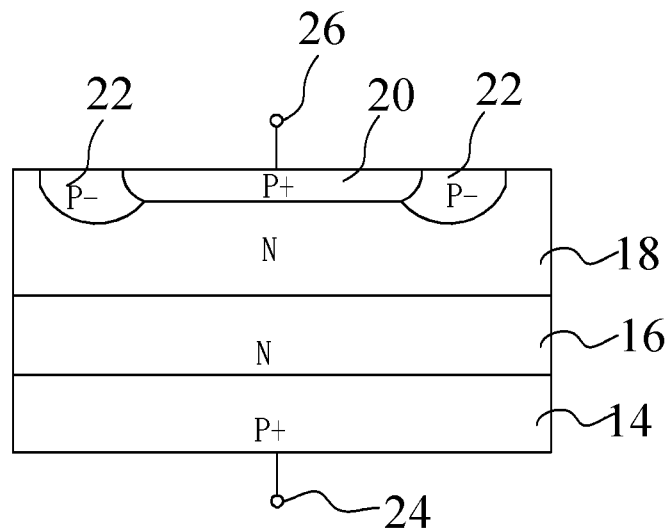

FIGS. 4(a)-4(b) are cross-sectional views of the steps for fabricating a bidirectional ESD protection device according to the first embodiment of the present invention. As shown in FIG. 4(a), the heavily-doped semiconductor substrate 14 is provided, the first semiconductor epitaxial layer 16 is formed on the heavily-doped semiconductor substrate 14, and the second semiconductor epitaxial layer 18 is formed on the first semiconductor epitaxial layer 16. Besides, the doping concentration of the first semiconductor epitaxial layer 16 is higher than the doping concentration of the second semiconductor epitaxial layer 18. As shown in FIG. 4(b), the heavily-doped area 20 and the lightly-doped area 22 are formed in the second semiconductor epitaxial layer 18 using the lithography technology. The lightly-doped area 22 surrounds the heavily-doped area 20 and covers the corner of the heavily-doped area 20. Alternatively or in combination, the lightly-doped area 22 contacts the sidewall of the heavily-doped area 20. The present invention should not be limited to the order of forming the heavily-doped area 20 and the lightly-doped area 22 in the second semiconductor epitaxial layer 18. For example, after forming the heavily-doped area 20, the lightly-doped area 22 is formed. Alternatively, after forming the lightly-doped area 22, the heavily-doped area 20 is formed.

Figure 5:
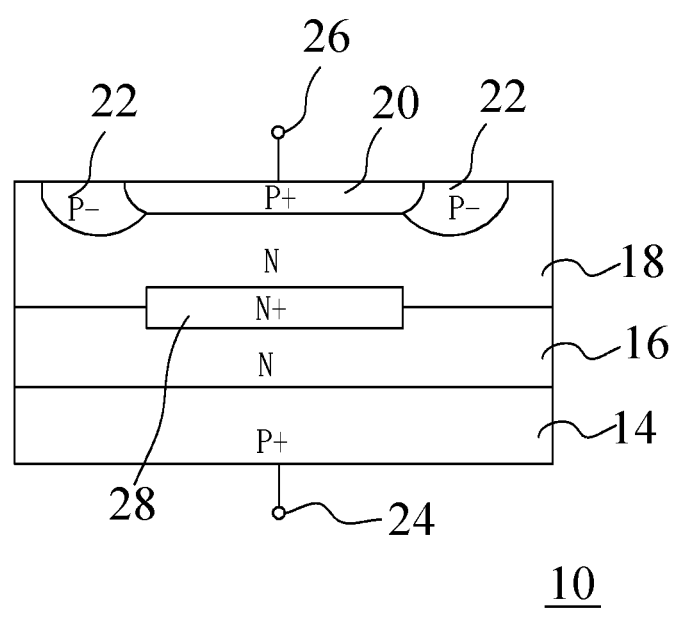
FIG. 5 is a cross-sectional view of a bidirectional ESD protection device according to the second embodiment of the present invention.

FIG. 5 is a cross-sectional view of a bidirectional electrostatic discharge (ESD) protection device according to the second embodiment of the present invention. Referring to FIG. 5, the second embodiment of the bidirectional ESD protection device 10 is introduced. Compared with the first embodiment, the second embodiment further comprises a heavily-doped buried layer 28, and the other structures have been described in the first embodiment so will not be reiterated. The heavily-doped buried layer 28 is formed between the first semiconductor epitaxial layer 16 and the second semiconductor epitaxial layer 18. The heavily-doped buried layer 28 has the second conductivity type, namely an N type. The heavily-doped buried layer 28 is used to reduce the on resistance of the bidirectional ESD protection device 10. The heavily-doped buried layer 28 may be located between the heavily-doped area 20 and the heavily-doped semiconductor substrate 14. However, the heavily-doped buried layer 28 covers a part of the first semiconductor epitaxial layer 16 or the entire first semiconductor epitaxial layer 16. The size of the heavily-doped buried layer 28 is adaptable according to requirements. The size of the heavily-doped buried layer 28 is adjusted to change the current gain of the vertical bipolar junction transistor.

When applying ESD energy to the bidirectional electrostatic discharge protection device 10, the heavily-doped semiconductor substrate 14 is coupled to a first conductive pin 24, the heavily-doped area 20 is coupled to a second conductive pin 26, and the heavily-doped buried layer 28, the first semiconductor epitaxial layer 16 and the second semiconductor epitaxial layer 18 are floating. When the first conductive pin 24 receives the positive ESD energy and the second conductive pin 26 receives grounding voltage, the breakdown event occurs at the junction between the second semiconductor epitaxial layer 18 and the heavily-doped area 20 and the ESD current flows from the first conductive pin 24 to the second conductive pin 26 through the heavily-doped semiconductor substrate 14, the first semiconductor epitaxial layer 16, the heavily-doped buried layer 28, the second semiconductor epitaxial layer 18, and the heavily-doped area 20. When the first conductive pin 24 receives the negative ESD energy and the second conductive pin 26 receives grounding voltage, the breakdown event occurs at the junction between the heavily-doped semiconductor substrate 14 and the first semiconductor epitaxial layer 16 and the ESD current flows from the second conductive pin 26 to the first conductive pin 24 through the heavily-doped area 20, the second semiconductor epitaxial layer 18, the heavily-doped buried layer 28, the first semiconductor epitaxial layer 16, and the heavily-doped semiconductor substrate 14.

Figure 6A:
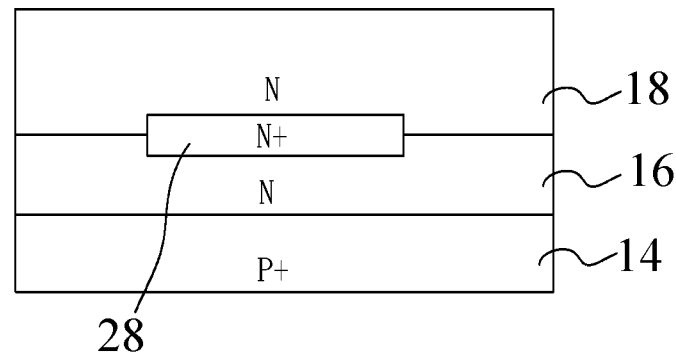
FIGS. 6(a)-6(b) are cross-sectional views of the steps for fabricating a bidirectional ESD protection device according to the second embodiment of the present invention.
Figure 6B:
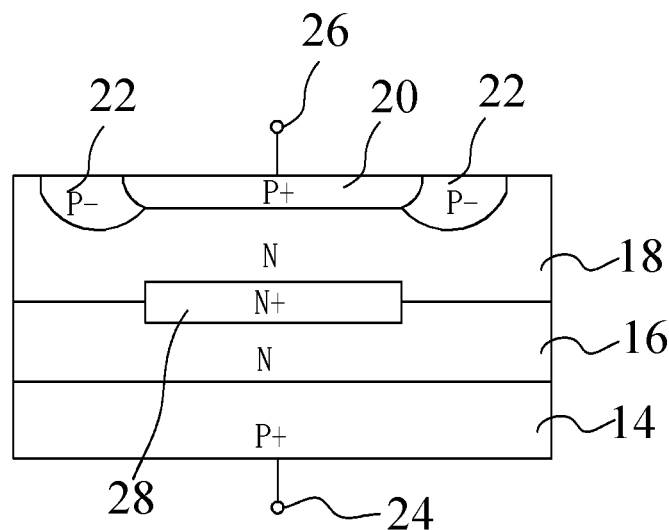

FIGS. 6(a)-6(b) are cross-sectional views of the steps for fabricating a bidirectional ESD protection device according to the second embodiment of the present invention. As shown in FIG. 6(a), the heavily-doped semiconductor substrate 14 is provided, the first semiconductor epitaxial layer 16 is formed on the heavily-doped semiconductor substrate 14, and the second semiconductor epitaxial layer 18 is formed on the first semiconductor epitaxial layer 16. Besides, the doping concentration of the first semiconductor epitaxial layer 16 is higher than the doping concentration of the second semiconductor epitaxial layer 18. The heavily-doped buried layer 28 of the second conductivity type is formed between the first semiconductor epitaxial layer 16 and the second semiconductor epitaxial layer 18 before the step of forming the second semiconductor epitaxial layer 18 on the first semiconductor epitaxial layer 16. Afterwards, as shown in FIG. 6(b), the heavily-doped area 20 and the lightly-doped area 22 are formed in the second semiconductor epitaxial layer 18 using the lithography technology. The lightly-doped area 22 surrounds the heavily-doped area 20 and covers the corner of the heavily-doped area 20. Alternatively or in combination, the lightly-doped area 22 contacts the sidewall of the heavily-doped area 20. The present invention should not be limited to the order of forming the heavily-doped area 20 and the lightly-doped area 22 in the second semiconductor epitaxial layer 18. For example, after forming the heavily-doped area 20, the lightly-doped area 22 is formed. Alternatively, after forming the lightly-doped area 22, the heavily-doped area 20 is formed.

Figure 7:
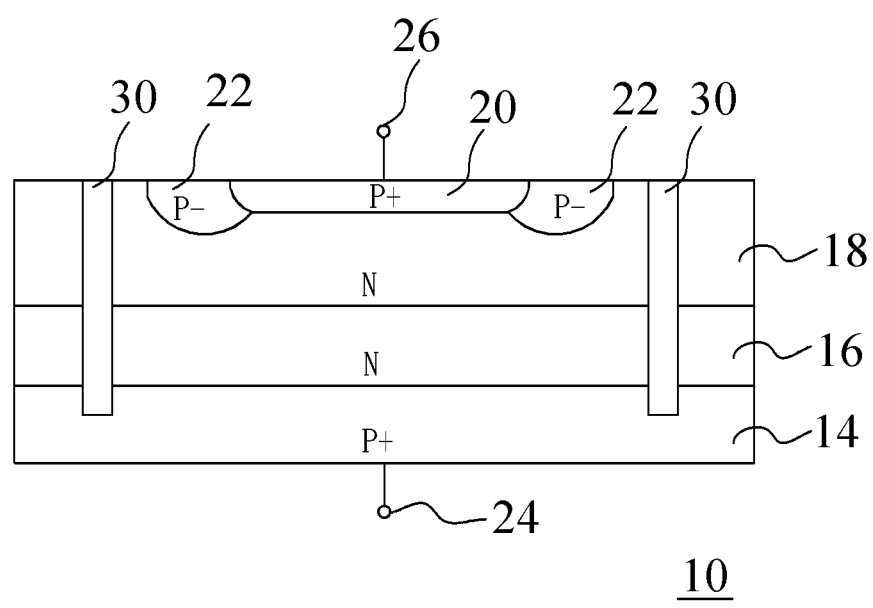
FIG. 7 is a cross-sectional view of a bidirectional ESD protection device according to the third embodiment of the present invention.

FIG. 7 is a cross-sectional view of a bidirectional electrostatic discharge (ESD) protection device according to the third embodiment of the present invention. Referring to FIG. 7, the third embodiment of the bidirectional ESD protection device 10 is introduced. Compared with the first embodiment, the third embodiment further comprises an isolation structure 30 formed in the heavily-doped semiconductor substrate 14, the first semiconductor epitaxial layer 16, and the second semiconductor epitaxial layer 18, and the other structures have been described in the first embodiment so will not be reiterated. For example, the isolation structure 30 comprises oxide, but the present invention is not limited thereto. The isolation structure 30 surrounds the heavily-doped area 20 and the lightly-doped area 22. The depth of the isolation structure 30 is at least deeper than the total thickness of the first semiconductor epitaxial layer 16 and the second semiconductor epitaxial layer 18.

When applying ESD energy to the bidirectional electrostatic discharge protection device 10, the heavily-doped semiconductor substrate 14 is coupled to a first conductive pin 24, the heavily-doped area 20 is coupled to a second conductive pin 26, and the first semiconductor epitaxial layer 16 and the second semiconductor epitaxial layer 18 are floating. When the first conductive pin 24 receives the positive ESD energy and the second conductive pin 26 receives grounding voltage, the breakdown event occurs at the junction between the second semiconductor epitaxial layer 18 and the heavily-doped area 20 and the ESD current flows from the first conductive pin 24 to the second conductive pin 26 through the heavily-doped semiconductor substrate 14, the first semiconductor epitaxial layer 16, the second semiconductor epitaxial layer 18, and the heavily-doped area 20. When the first conductive pin 24 receives the negative ESD energy and the second conductive pin 26 receives grounding voltage, the breakdown event occurs at the junction between the heavily-doped semiconductor substrate 14 and the first semiconductor epitaxial layer 16 and the ESD current flows from the second conductive pin 26 to the first conductive pin 24 through the heavily-doped area 20, the second semiconductor epitaxial layer 18, the first semiconductor epitaxial layer 16, and the heavily-doped semiconductor substrate 14. For the positive ESD energy or the negative ESD energy, the ESD current is confined in a space surrounded by the isolation structure 30 in order to make the ESD current pass through the shortest path that the ESD robustness is improved.

Figure 8A:
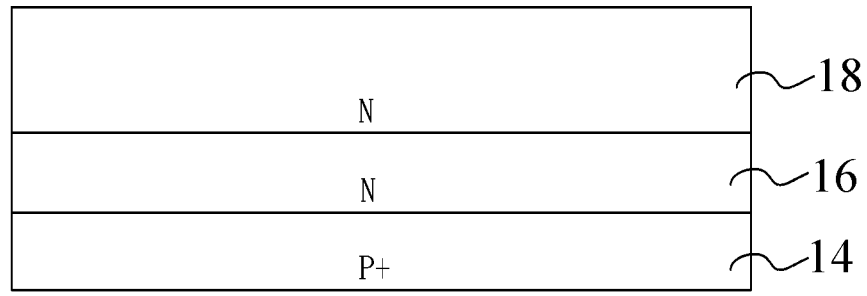
FIGS. 8(a)-8(b) are cross-sectional views of the steps for fabricating a bidirectional ESD protection device according to the third embodiment of the present invention.
Figure 8B:
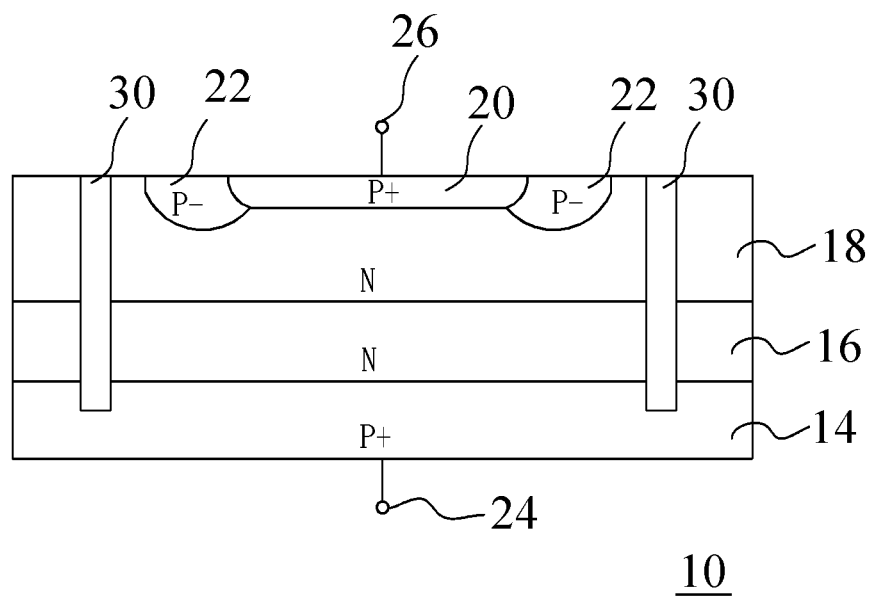

FIGS. 8(a)-8(b) are cross-sectional views of the steps for fabricating a bidirectional ESD protection device according to the third embodiment of the present invention. As shown in FIG. 8(a), the heavily-doped semiconductor substrate 14 is provided, the first semiconductor epitaxial layer 16 is formed on the heavily-doped semiconductor substrate 14, and the second semiconductor epitaxial layer 18 is formed on the first semiconductor epitaxial layer 16. Besides, the doping concentration of the first semiconductor epitaxial layer 16 is higher than the doping concentration of the second semiconductor epitaxial layer 18. As shown in FIG. 8(b), the heavily-doped area 20 and the lightly-doped area 22 are formed in the second semiconductor epitaxial layer 18 using the lithography technology. The lightly-doped area 22 surrounds the heavily-doped area 20 and covers the corner of the heavily-doped area 20. In addition, the isolation structure 30 is formed in the heavily-doped semiconductor substrate 14, the first semiconductor epitaxial layer 16, and the second semiconductor epitaxial layer 18 using the lithography technology. The isolation structure 30 surrounds the heavily-doped area 20 and the lightly-doped area 22. Alternatively or in combination, the lightly-doped area 22 contacts the sidewall of the heavily-doped area 20. The present invention should not be limited to the order of forming the isolation structure 30, the heavily-doped area 20 and the lightly-doped area 22. The order of forming the isolation structure 30, the heavily-doped area 20 and the lightly-doped area 22 is adaptable according to requirements.

Figure 9:
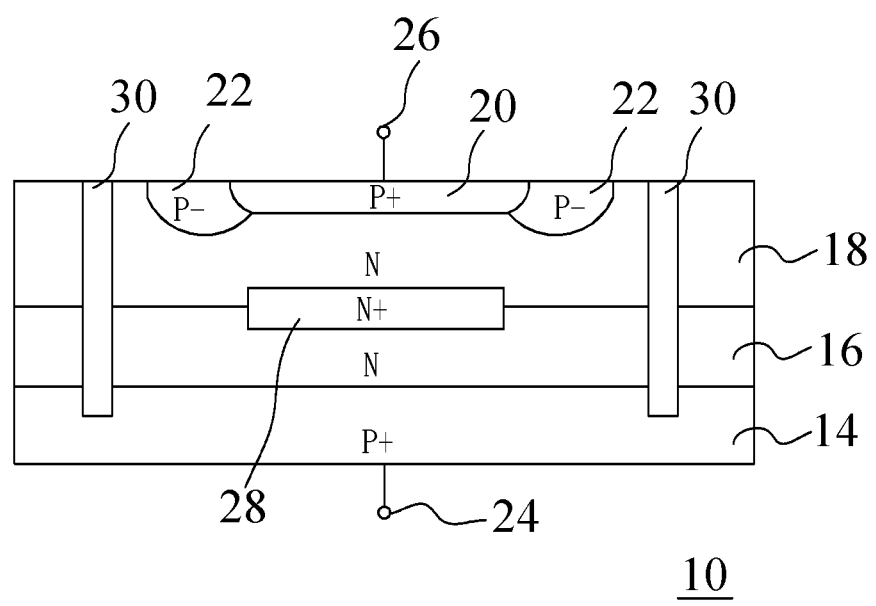
FIG. 9 is a cross-sectional view of a bidirectional ESD protection device according to the fourth embodiment of the present invention.

FIG. 9 is a cross-sectional view of a bidirectional electrostatic discharge (ESD) protection device according to the fourth embodiment of the present invention. Referring to FIG. 9, the fourth embodiment of the bidirectional ESD protection device 10 is introduced. Compared with the third embodiment, the fourth embodiment further comprises a heavily-doped buried layer 28, and the other structures have been described in the third embodiment so will not be reiterated. The heavily-doped buried layer 28 is formed between the first semiconductor epitaxial layer 16 and the second semiconductor epitaxial layer 18 and confined in a space surrounded by the isolation structure 30 in order to make the ESD current pass through the shortest path. The heavily-doped buried layer 28 has the second conductivity type, namely an N type. The heavily-doped buried layer 28 is used to reduce the on resistance of the bidirectional ESD protection device 10. The heavily-doped buried layer 28 may be located between the heavily-doped area 20 and the heavily-doped semiconductor substrate 14. However, the heavily-doped buried layer 28 covers a part of the first semiconductor epitaxial layer 16 or the entire first semiconductor epitaxial layer 16. The size of the heavily-doped buried layer 28 is adaptable according to requirements. The size of the heavily-doped buried layer 28 is adjusted to change the current gain of the vertical bipolar junction transistor.

When applying ESD energy to the bidirectional electrostatic discharge protection device 10, the heavily-doped semiconductor substrate 14 is coupled to a first conductive pin 24, the heavily-doped area 20 is coupled to a second conductive pin 26, and the heavily-doped buried layer 28, the first semiconductor epitaxial layer 16 and the second semiconductor epitaxial layer 18 are floating. When the first conductive pin 24 receives the positive ESD energy and the second conductive pin 26 receives grounding voltage, the breakdown event occurs at the junction between the second semiconductor epitaxial layer 18 and the heavily-doped area 20 and the ESD current flows from the first conductive pin 24 to the second conductive pin 26 through the heavily-doped semiconductor substrate 14, the first semiconductor epitaxial layer 16, the heavily-doped buried layer 28, the second semiconductor epitaxial layer 18, and the heavily-doped area 20. When the first conductive pin 24 receives the negative ESD energy and the second conductive pin 26 receives grounding voltage, the breakdown event occurs at the junction between the heavily-doped semiconductor substrate 14 and the first semiconductor epitaxial layer 16 and the ESD current flows from the second conductive pin 26 to the first conductive pin 24 through the heavily-doped area 20, the second semiconductor epitaxial layer 18, the heavily-doped buried layer 28, the first semiconductor epitaxial layer 16, and the heavily-doped semiconductor substrate 14. For the positive ESD energy or the negative ESD energy, the breakdown current is confined in a space surrounded by the isolation structure 30 in order to improve make the ESD current pass through the shortest path that the ESD robustness is improved.

Figure 10A:
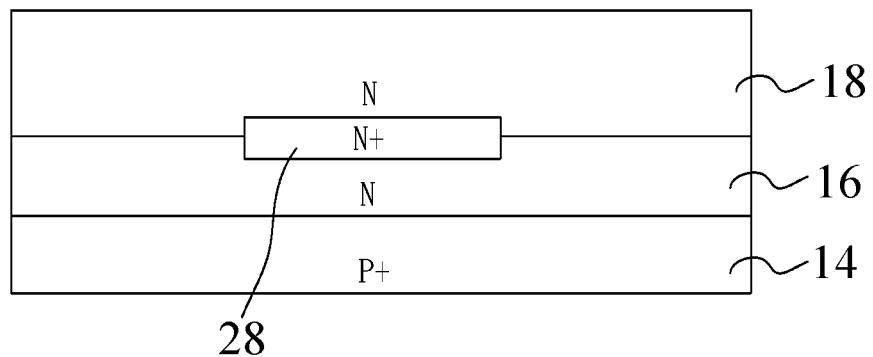
FIGS. 10(a)-10(b) are cross-sectional views of the steps for fabricating a bidirectional ESD protection device according to the fourth embodiment of the present invention.
Figure 10B:
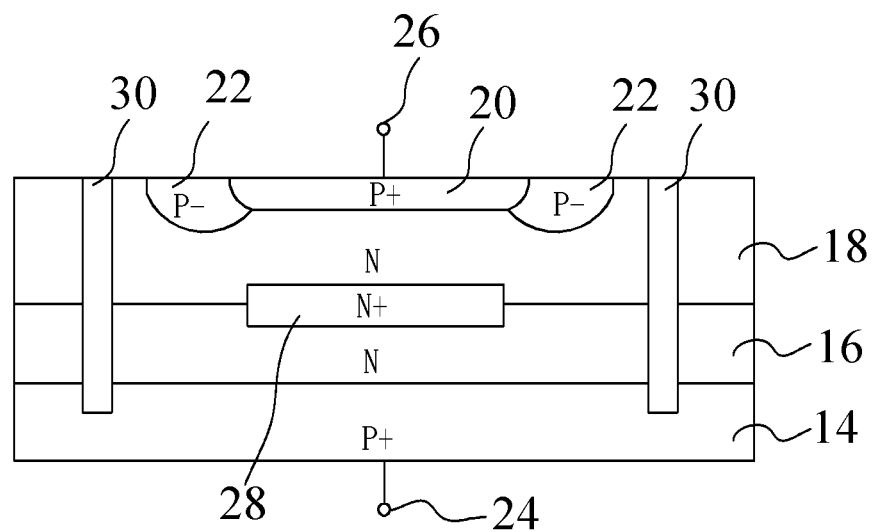

FIGS. 10(a)-10(b) are cross-sectional views of the steps for fabricating a bidirectional ESD protection device according to the fourth embodiment of the present invention. As shown in FIG. 10(a), the heavily-doped semiconductor substrate 14 is provided, the first semiconductor epitaxial layer 16 is formed on the heavily-doped semiconductor substrate 14, and the second semiconductor epitaxial layer 18 is formed on the first semiconductor epitaxial layer 16. Besides, the doping concentration of the first semiconductor epitaxial layer 16 is higher than the doping concentration of the second semiconductor epitaxial layer 18. The heavily-doped buried layer 28 of the second conductivity type is formed between the first semiconductor epitaxial layer 16 and the second semiconductor epitaxial layer 18 before the step of forming the second semiconductor epitaxial layer 18 on the first semiconductor epitaxial layer 16. Afterwards, as shown in FIG. 10(b), the heavily-doped area 20 and the lightly-doped area 22 are formed in the second semiconductor epitaxial layer 18 using the lithography technology. The lightly-doped area 22 surrounds the heavily-doped area 20 and covers the corner of the heavily-doped area 20. In addition, the isolation structure 30 is formed in the heavily-doped semiconductor substrate 14, the first semiconductor epitaxial layer 16, and the second semiconductor epitaxial layer 18 using the lithography technology. The isolation structure 30 surrounds the heavily-doped area 20 and the lightly-doped area 22. Alternatively or in combination, the lightly-doped area 22 contacts the sidewall of the heavily-doped area 20. The present invention should not be limited to the order of forming the isolation structure 30, the heavily-doped area 20 and the lightly-doped area 22. The order of forming the isolation structure 30, the heavily-doped area 20 and the lightly-doped area 22 is adaptable according to requirements.

Figure 11:
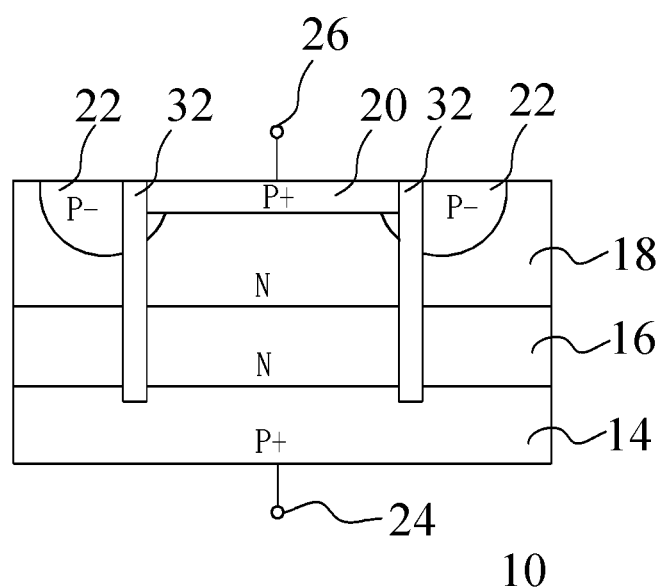
FIG. 11 is a cross-sectional view of a bidirectional ESD protection device according to the fifth embodiment of the present invention.

FIG. 11 is a cross-sectional view of a bidirectional electrostatic discharge (ESD) protection device according to the fifth embodiment of the present invention. Referring to FIG. 11, the fifth embodiment of the bidirectional ESD protection device 10 is introduced. Compared with the first embodiment, the fifth embodiment further comprises an isolation structure 32 formed in the heavily-doped semiconductor substrate 14, the first semiconductor epitaxial layer 16, and the second semiconductor epitaxial layer 18, and the other structures have been described in the first embodiment so will not be reiterated. For example, the isolation structure 30 comprises oxide, but the present invention is not limited thereto. The isolation structure 32 surrounds the heavily-doped area 20, and the lightly-doped area 22 surrounds the isolation structure 32. In other words, the isolation structure 32 is located between the heavily-doped area 20 and the lightly-doped area 22 and used to further prevent the ESD current from flowing to the surroundings of the heavily-doped area 20. The depth of the isolation structure 32 is at least deeper than the total thickness of the first semiconductor epitaxial layer 16 and the second semiconductor epitaxial layer 18.

When applying ESD energy to the bidirectional electrostatic discharge protection device 10, the heavily-doped semiconductor substrate 14 is coupled to a first conductive pin 24, the heavily-doped area 20 is coupled to a second conductive pin 26, and the first semiconductor epitaxial layer 16 and the second semiconductor epitaxial layer 18 are floating. When the first conductive pin 24 receives the positive ESD energy and the second conductive pin 26 receives grounding voltage, the breakdown event occurs at the junction between the second semiconductor epitaxial layer 18 and the heavily-doped area 20 and the ESD current flows from the first conductive pin 24 to the second conductive pin 26 through the heavily-doped semiconductor substrate 14, the first semiconductor epitaxial layer 16, the second semiconductor epitaxial layer 18, and the heavily-doped area 20. When the first conductive pin 24 receives the negative ESD energy and the second conductive pin 26 receives grounding voltage, the breakdown event occurs at the junction between the heavily-doped semiconductor substrate 14 and the first semiconductor epitaxial layer 16 and the ESD current flows from the second conductive pin 26 to the first conductive pin 24 through the heavily-doped area 20, the second semiconductor epitaxial layer 18, the first semiconductor epitaxial layer 16, and the heavily-doped semiconductor substrate 14. For the positive ESD energy or the negative ESD energy, the breakdown current is confined in a space surrounded by the isolation structure 32 in order to make the ESD current pass through the shortest path that the ESD robustness is improved.

Figure 12A:
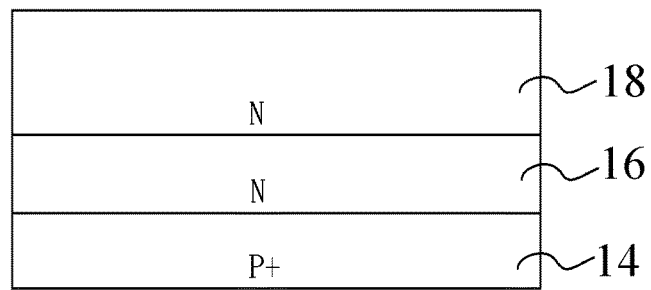
FIGS. 12(a)-12(c) are cross-sectional views of the steps for fabricating a bidirectional ESD protection device according to the fifth embodiment of the present invention.
Figure 12B:
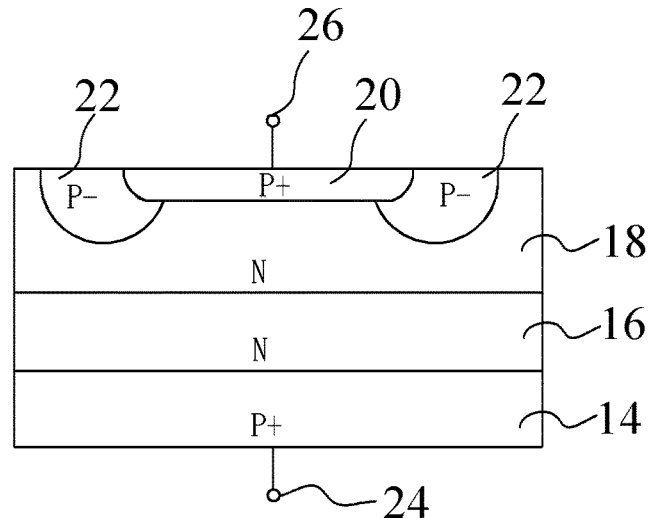
Figure 12C:
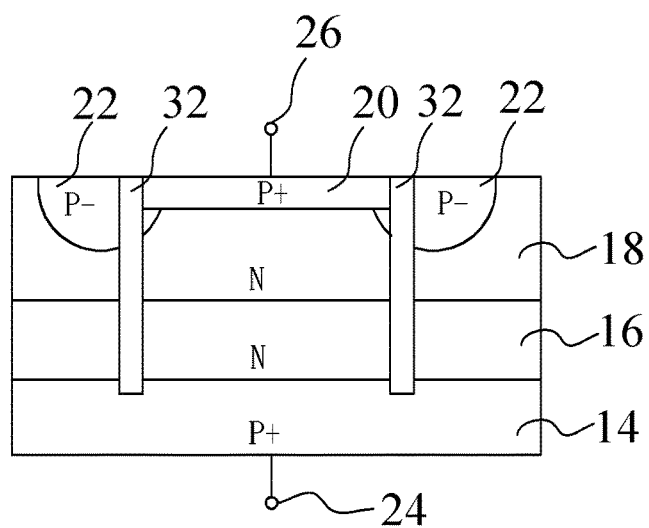

FIGS. 12(a)-12(c) are cross-sectional views of the steps for fabricating a bidirectional ESD protection device according to the fifth embodiment of the present invention. As shown in FIG. 12(a), the heavily-doped semiconductor substrate 14 is provided, the first semiconductor epitaxial layer 16 is formed on the heavily-doped semiconductor substrate 14, and the second semiconductor epitaxial layer 18 is formed on the first semiconductor epitaxial layer 16. Besides, the doping concentration of the first semiconductor epitaxial layer 16 is higher than the doping concentration of the second semiconductor epitaxial layer 18. As shown in FIG. 12(b), the heavily-doped area 20 and the lightly-doped area 22 are formed in the second semiconductor epitaxial layer 18 using the lithography technology. The lightly-doped area 22 surrounds the heavily-doped area 20 and covers the corner of the heavily-doped area 20. The present invention should not be limited to the order of forming the heavily-doped area 20 and the lightly-doped area 22. The order of forming the heavily-doped area 20 and the lightly-doped area 22 is adaptable according to requirements. As shown in FIG. 12(c), the isolation structure 32 is formed in the heavily-doped semiconductor substrate 14, the first semiconductor epitaxial layer 16, and the second semiconductor epitaxial layer 18 using the lithography technology. The isolation structure 32 surrounds the heavily-doped area 20, and the lightly-doped area 22 surrounds the isolation structure 32.

Figure 13:
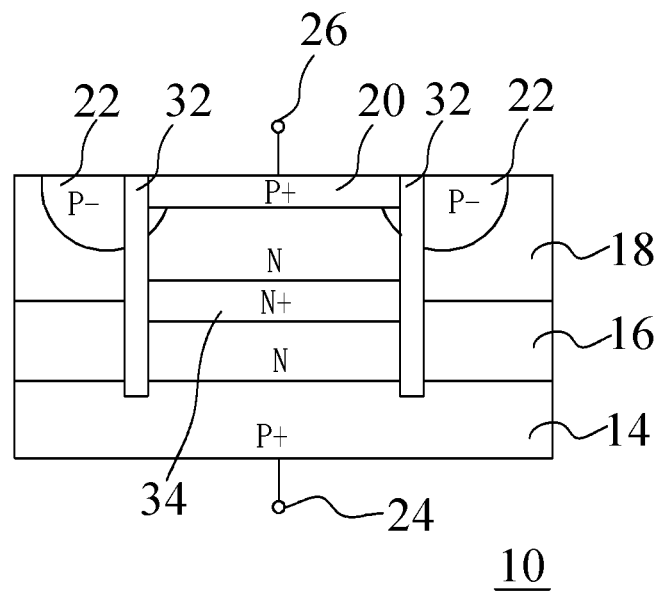
FIG. 13 is a cross-sectional view of a bidirectional ESD protection device according to the sixth embodiment of the present invention.

FIG. 13 is a cross-sectional view of a bidirectional electrostatic discharge (ESD) protection device according to the sixth embodiment of the present invention. Referring to FIG. 13, the sixth embodiment of the bidirectional ESD protection device 10 is introduced. Compared with the fifth embodiment, the sixth embodiment further comprises a heavily-doped buried layer 34, and the other structures have been described in the fifth embodiment so will not be reiterated. The heavily-doped buried layer 34 is formed between the first semiconductor epitaxial layer 16 and the second semiconductor epitaxial layer 18 and confined in a space surrounded by the isolation structure 32 in order to make the ESD current pass through the shortest path. The heavily-doped buried layer 34 has the second conductivity type, namely an N type. The heavily-doped buried layer 34 is used to reduce the on resistance of the bidirectional ESD protection device 10. The heavily-doped buried layer 34 may be located between the heavily-doped area 20 and the heavily-doped semiconductor substrate 14. However, the heavily-doped buried layer 34 covers a part of the first semiconductor epitaxial layer 16 or the entire first semiconductor epitaxial layer 16. The size of the heavily-doped buried layer 34 is adaptable according to requirements. The size of the heavily-doped buried layer 34 is adjusted to change the current gain of the vertical bipolar junction transistor.

When applying ESD energy to the bidirectional electrostatic discharge protection device 10, the heavily-doped semiconductor substrate 14 is coupled to a first conductive pin 24, the heavily-doped area 20 is coupled to a second conductive pin 26, and the heavily-doped buried layer 34, the first semiconductor epitaxial layer 16 and the second semiconductor epitaxial layer 18 are floating. When the first conductive pin 24 receives the positive ESD energy and the second conductive pin 26 receives grounding voltage, the breakdown event occurs at the junction between the second semiconductor epitaxial layer 18 and the heavily-doped area 20 and the ESD current flows from the first conductive pin 24 to the second conductive pin 26 through the heavily-doped semiconductor substrate 14, the first semiconductor epitaxial layer 16, the heavily-doped buried layer 34, the second semiconductor epitaxial layer 18, and the heavily-doped area 20. When the first conductive pin 24 receives the negative ESD energy and the second conductive pin 26 receives grounding voltage, the breakdown event occurs at the junction between the heavily-doped semiconductor substrate 14 and the first semiconductor epitaxial layer 16 and the ESD current flows from the second conductive pin 26 to the first conductive pin 24 through the heavily-doped area 20, the second semiconductor epitaxial layer 18, the heavily-doped buried layer 34, the first semiconductor epitaxial layer 16, and the heavily-doped semiconductor substrate 14. For the positive ESD energy or the negative ESD energy, the ESD current is confined in a space surrounded by the isolation structure 32 in order to make the ESD current pass through the shortest path that the ESD robustness is improved.

Figure 14A:
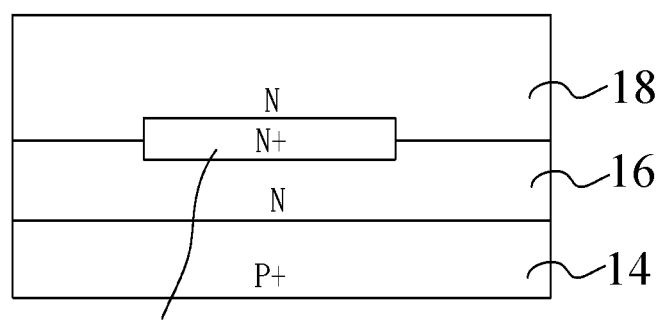
FIGS. 14(a)-14(c) are cross-sectional views of the steps for fabricating a bidirectional ESD protection device according to the sixth embodiment of the present invention.
Figure 14B:
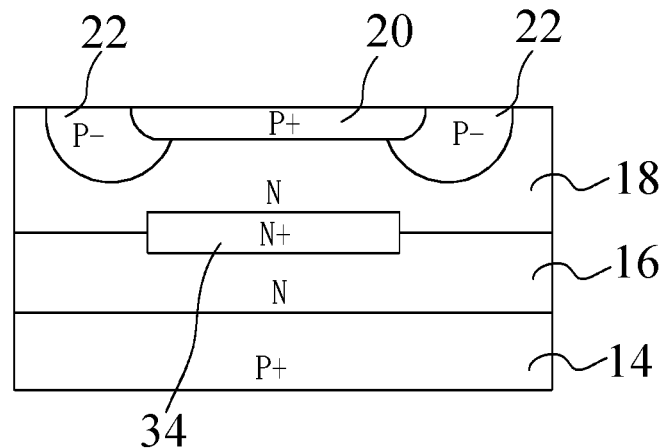
Figure 14C:
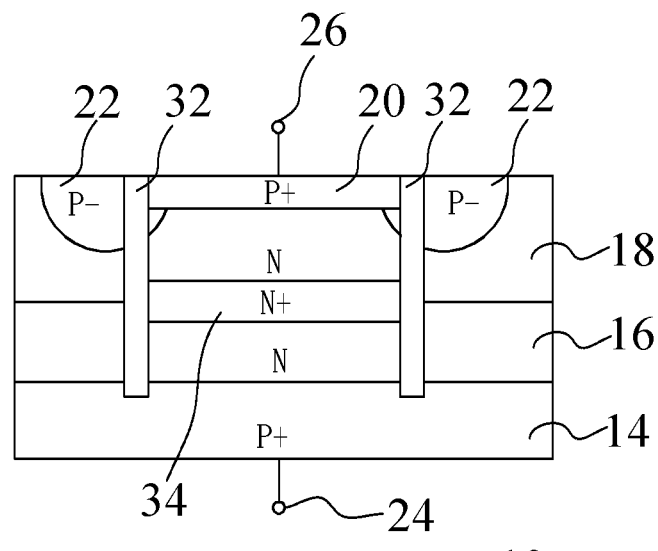

FIGS. 14(a)-14(c) are cross-sectional views of the steps for fabricating a bidirectional ESD protection device according to the sixth embodiment of the present invention. As shown in FIG. 14(a), the heavily-doped semiconductor substrate 14 is provided, the first semiconductor epitaxial layer 16 is formed on the heavily-doped semiconductor substrate 14, and the second semiconductor epitaxial layer 18 is formed on the first semiconductor epitaxial layer 16. Besides, the doping concentration of the first semiconductor epitaxial layer 16 is higher than the doping concentration of the second semiconductor epitaxial layer 18. The heavily-doped buried layer 34 of the second conductivity type is formed between the first semiconductor epitaxial layer 16 and the second semiconductor epitaxial layer 18 before the step of forming the second semiconductor epitaxial layer 18 on the first semiconductor epitaxial layer 16. Afterwards, as shown in FIG. 14(b), the heavily-doped area 20 and the lightly-doped area 22 are formed in the second semiconductor epitaxial layer 18 using the lithography technology. The lightly-doped area 22 surrounds the heavily-doped area 20 and covers the corner of the heavily-doped area 20. The order of forming the heavily-doped area 20 and the lightly-doped area 22 is adaptable according to requirements. As shown in FIG. 14(c), the isolation structure 32 is formed in the heavily-doped semiconductor substrate 14, the first semiconductor epitaxial layer 16, and the second semiconductor epitaxial layer 18 using the lithography technology. The isolation structure 32 surrounds the heavily-doped area 20, and the lightly-doped area 22 surrounds the isolation structure 32.

Figure 15:
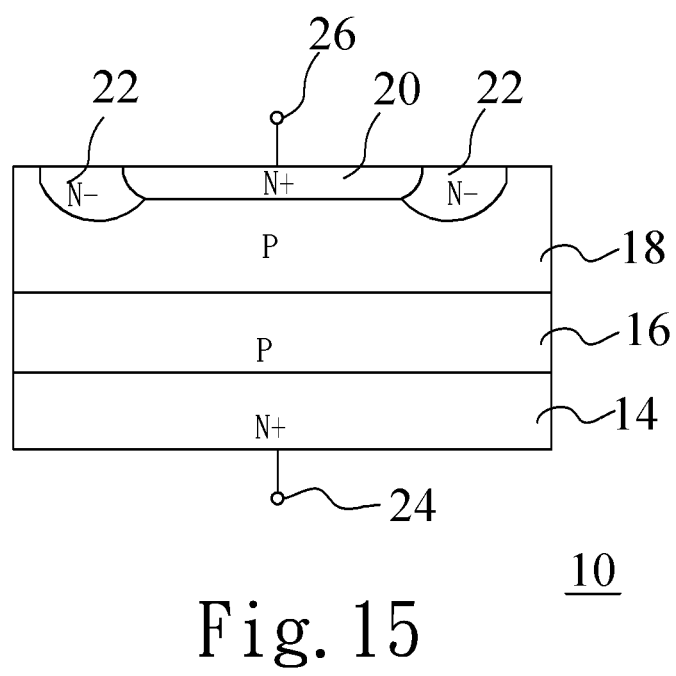
FIG. 15 is a cross-sectional view of a bidirectional ESD protection device according to the seventh embodiment of the present invention.
Figure 16A:
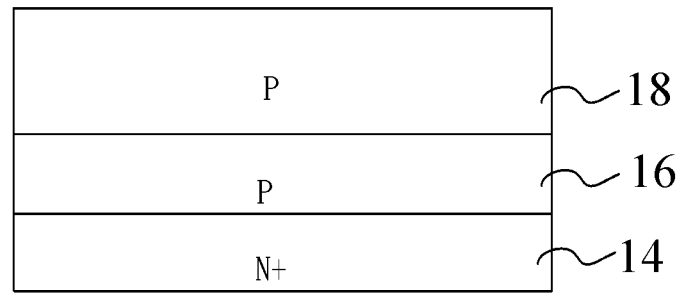
FIGS. 16(a)-16(b) are cross-sectional views of the steps for fabricating a bidirectional ESD protection device according to the seventh embodiment of the present invention.
Figure 16B:
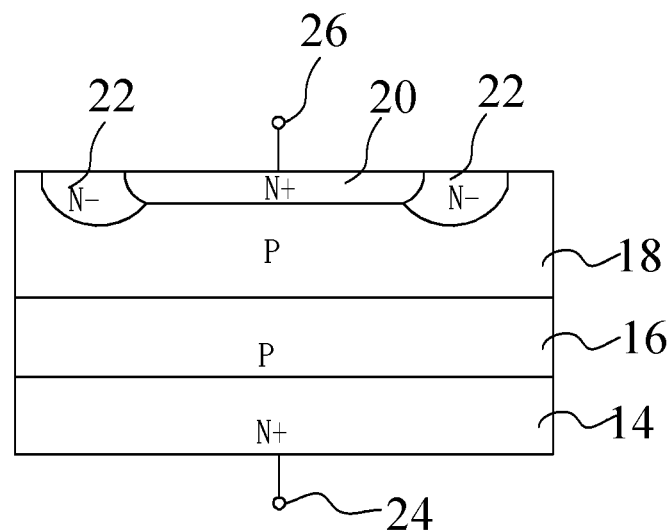

FIG. 15 is a cross-sectional view of a bidirectional ESD protection device according to the seventh embodiment of the present invention. FIGS. 16(a)-16(b) are cross-sectional views of the steps for fabricating a bidirectional ESD protection device according to the seventh embodiment of the present invention. The seventh embodiment is different from the first embodiment in the conductivity types. The first conductivity type and the second conductivity type of the seventh embodiment are respectively an N type and a P type, so that a vertical NPN bipolar junction transistor is formed. The other structures and the fabrication method of the seventh embodiment have been described in the first embodiment so will not be reiterated.

Figure 17:
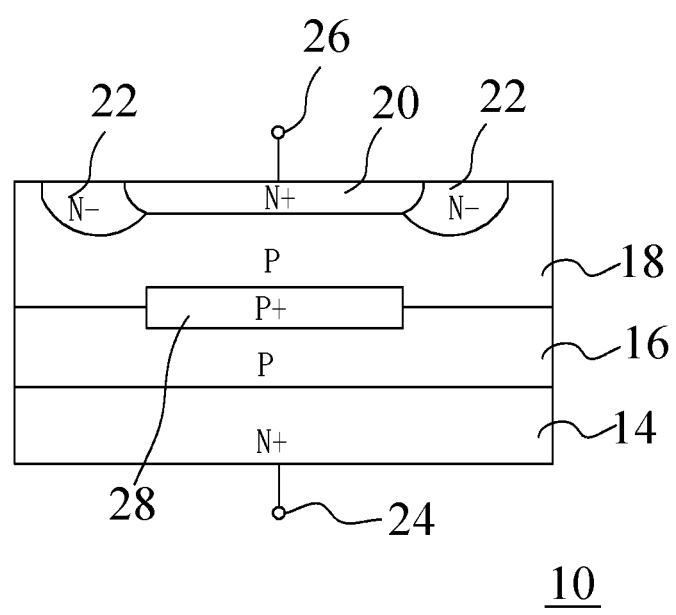
FIG. 17 is a cross-sectional view of a bidirectional ESD protection device according to the eighth embodiment of the present invention.
Figure 18A:
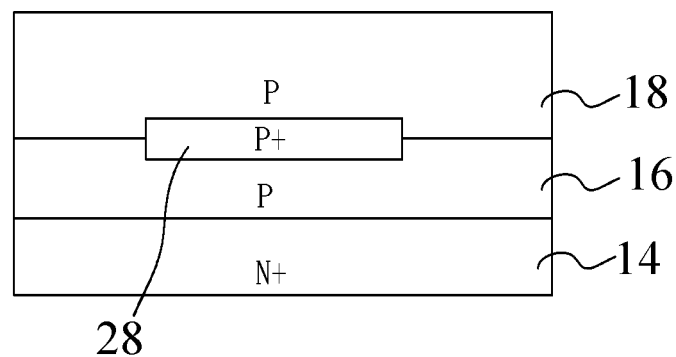
FIGS. 18(a)-18(b) are cross-sectional views of the steps for fabricating a bidirectional ESD protection device according to the eighth embodiment of the present invention.
Figure 18B:
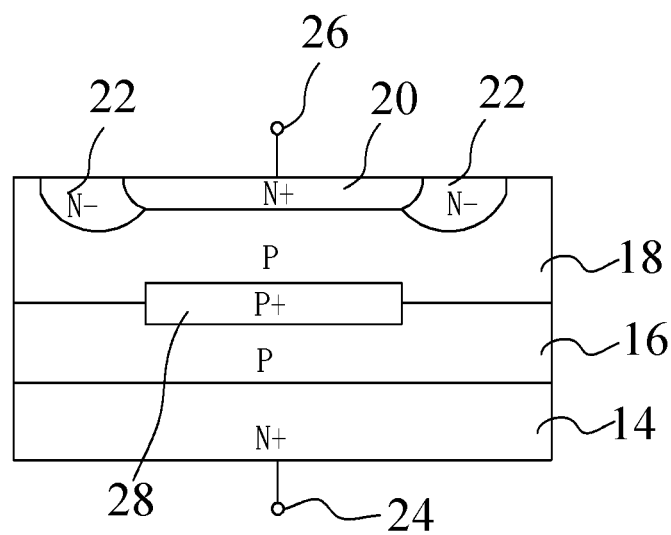

FIG. 17 is a cross-sectional view of a bidirectional ESD protection device according to the eighth embodiment of the present invention. FIGS. 18(a)-18(b) are cross-sectional views of the steps for fabricating a bidirectional ESD protection device according to the eighth embodiment of the present invention. The eighth embodiment is different from the second embodiment in the conductivity types. The first conductivity type and the second conductivity type of the eighth embodiment are respectively an N type and a P type, so that a vertical NPN bipolar junction transistor is formed. The other structures and the fabrication method of the eighth embodiment have been described in the second embodiment so will not be reiterated.

Figure 19:
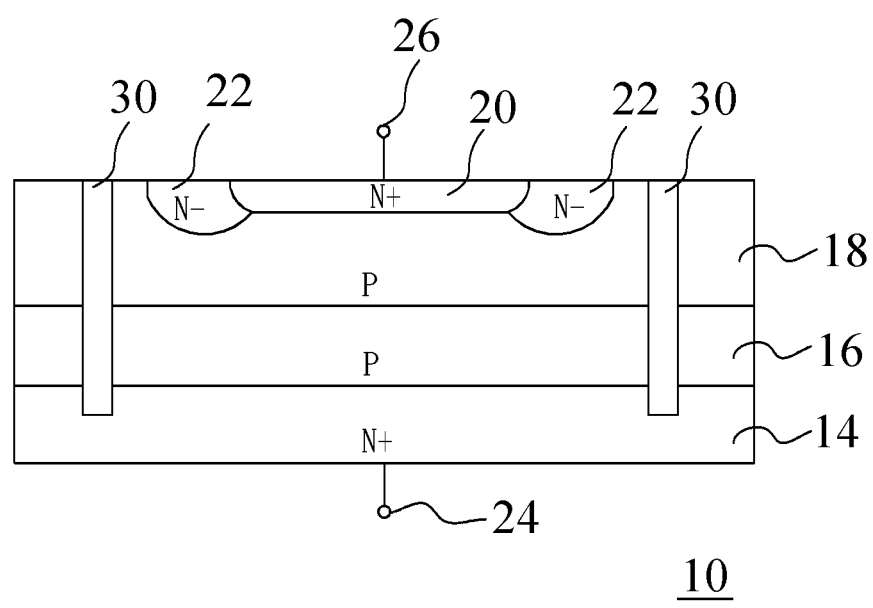
FIG. 19 is a cross-sectional view of a bidirectional ESD protection device according to the ninth embodiment of the present invention.
Figure 20A:
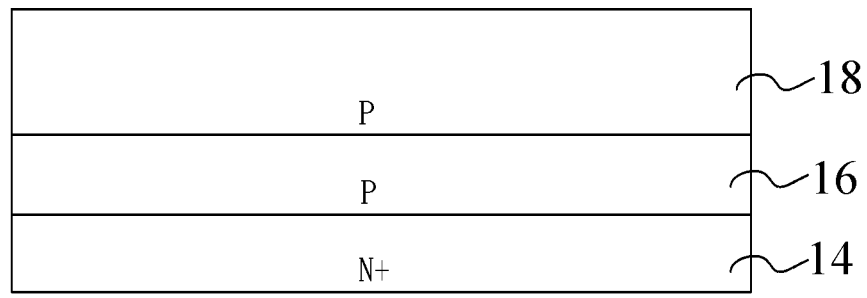
FIGS. 20(a)-20(b) are cross-sectional views of the steps for fabricating a bidirectional ESD protection device according to the ninth embodiment of the present invention.
Figure 20B:
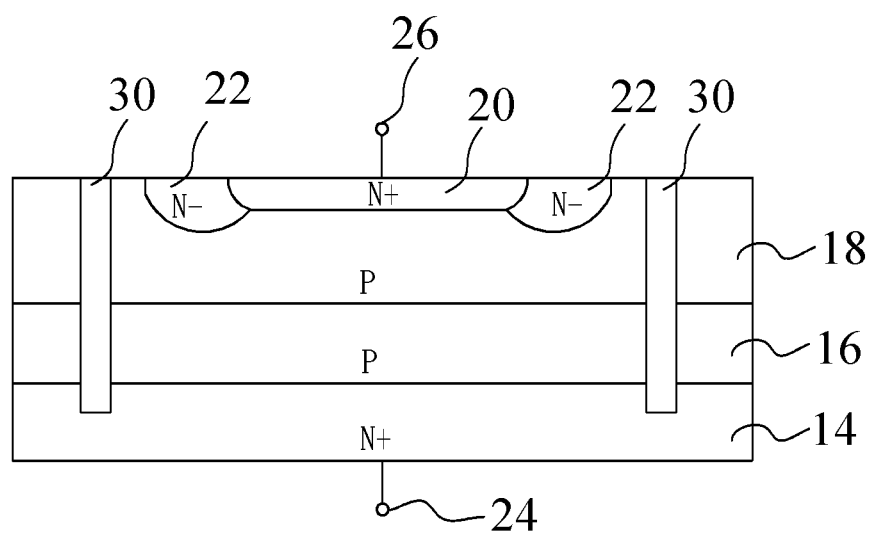

FIG. 19 is a cross-sectional view of a bidirectional ESD protection device according to the ninth embodiment of the present invention. FIGS. 20(a)-20(b) are cross-sectional views of the steps for fabricating a bidirectional ESD protection device according to the ninth embodiment of the present invention. The ninth embodiment is different from the third embodiment in the conductivity types. The first conductivity type and the second conductivity type of the ninth embodiment are respectively an N type and a P type, so that a vertical NPN bipolar junction transistor is formed. The other structures and the fabrication method of the ninth embodiment have been described in the third embodiment so will not be reiterated.

Figure 21:
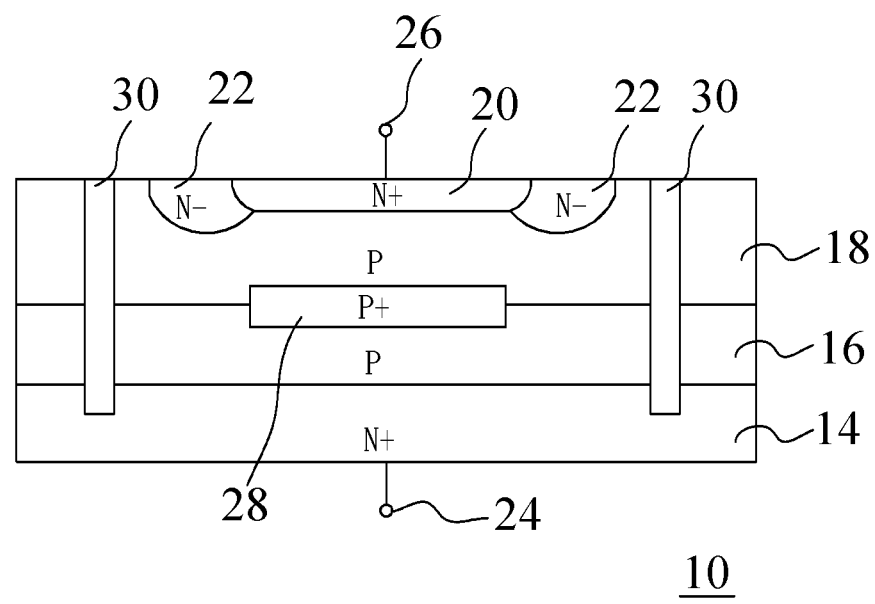
FIG. 21 is a cross-sectional view of a bidirectional ESD protection device according to the tenth embodiment of the present invention.
Figure 22A:
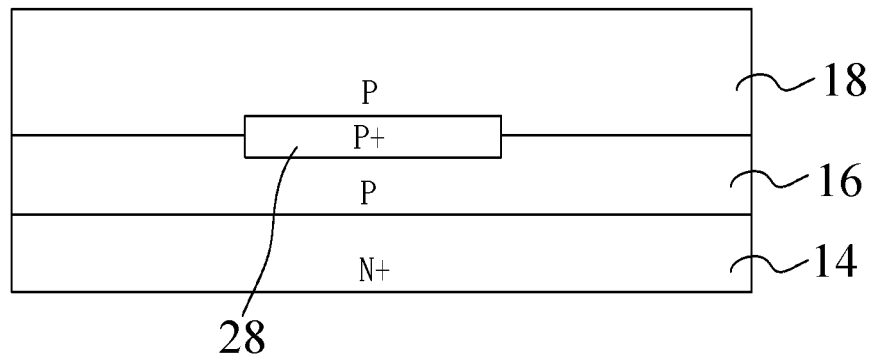
FIGS. 22(a)-22(b) are cross-sectional views of the steps for fabricating a bidirectional ESD protection device according to the tenth embodiment of the present invention.
Figure 22B:
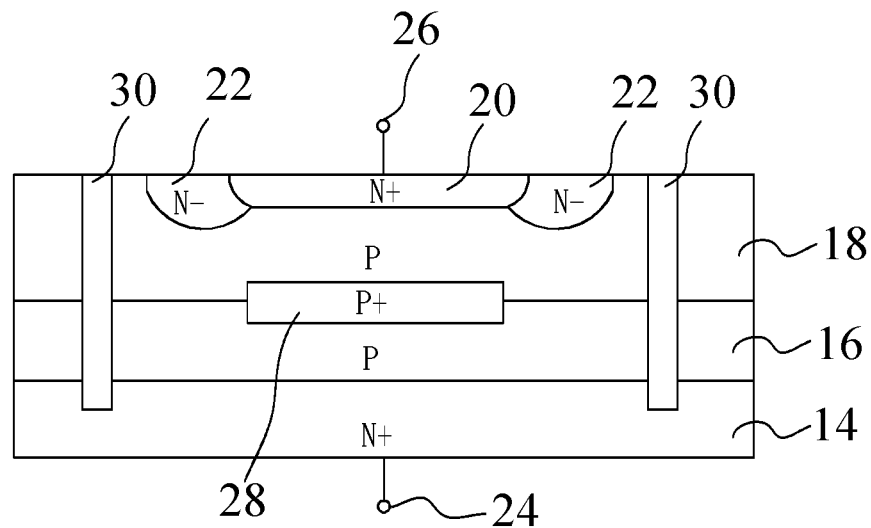

FIG. 21 is a cross-sectional view of a bidirectional ESD protection device according to the tenth embodiment of the present invention. FIGS. 22(a)-22(b) are cross-sectional views of the steps for fabricating a bidirectional ESD protection device according to the tenth embodiment of the present invention. The tenth embodiment is different from the fourth embodiment in the conductivity types. The first conductivity type and the second conductivity type of the tenth embodiment are respectively an N type and a P type, so that a vertical NPN bipolar junction transistor is formed. The other structures and the fabrication method of the tenth embodiment have been described in the fourth embodiment so will not be reiterated.

Figure 23:
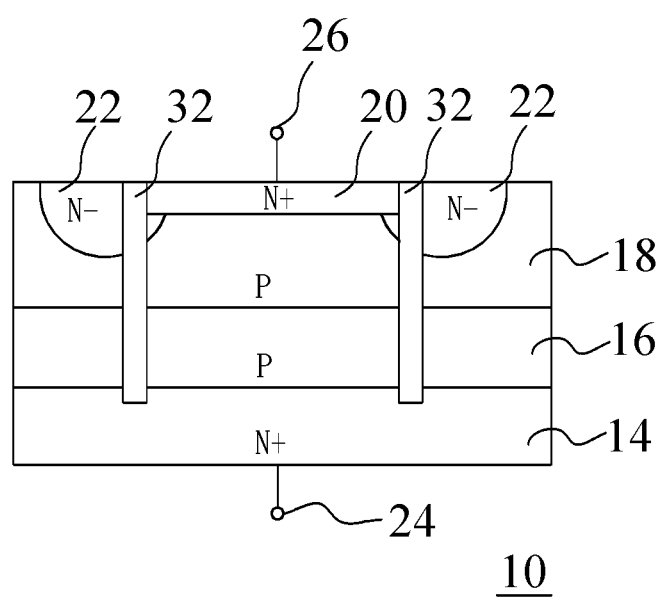
FIG. 23 is a cross-sectional view of a bidirectional ESD protection device according to the eleventh embodiment of the present invention.
Figure 24A:
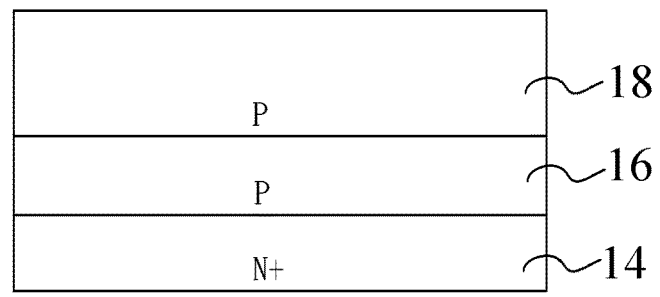
FIGS. 24(a)-24(c) are cross-sectional views of the steps for fabricating a bidirectional ESD protection device according to the eleventh embodiment of the present invention.
Figure 24B:
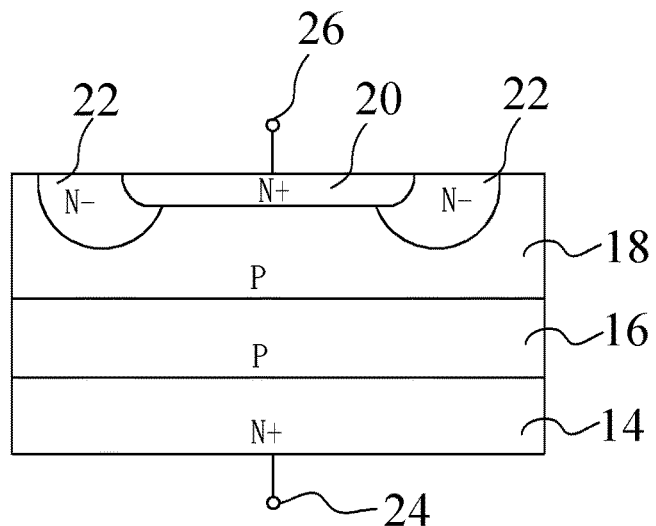
Figure 24C:
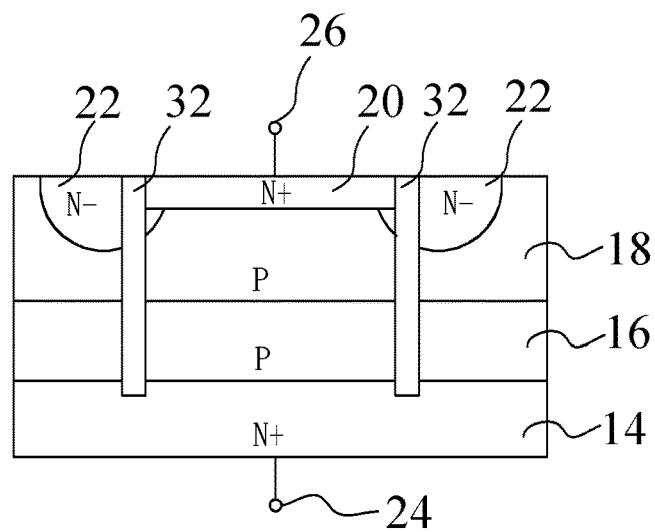

FIG. 23 is a cross-sectional view of a bidirectional ESD protection device according to the eleventh embodiment of the present invention. FIGS. 24(a)-24(c) are cross-sectional views of the steps for fabricating a bidirectional ESD protection device according to the eleventh embodiment of the present invention. The eleventh embodiment is different from the fifth embodiment in the conductivity types. The first conductivity type and the second conductivity type of the eleventh embodiment are respectively an N type and a P type, so that a vertical NPN bipolar junction transistor is formed. The other structures and the fabrication method of the eleventh embodiment have been described in the fifth embodiment so will not be reiterated.

Figure 25:
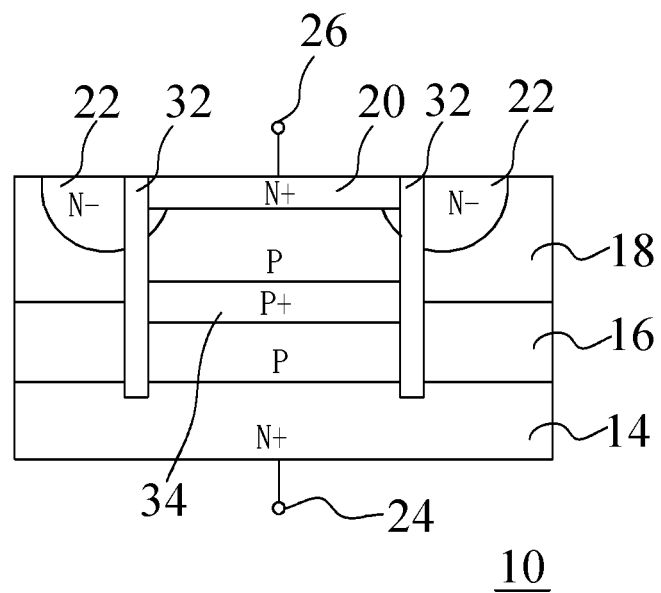
FIG. 25 is a cross-sectional view of a bidirectional ESD protection device according to the twelfth embodiment of the present invention.
Figure 26A:
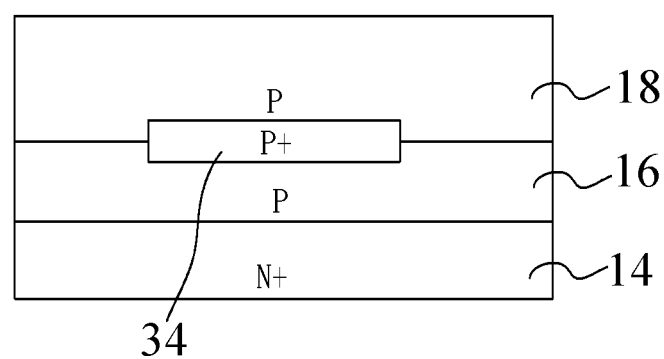
FIGS. 26(a)-26(c) are cross-sectional views of the steps for fabricating a bidirectional ESD protection device according to the twelfth embodiment of the present invention.
Figure 26B:
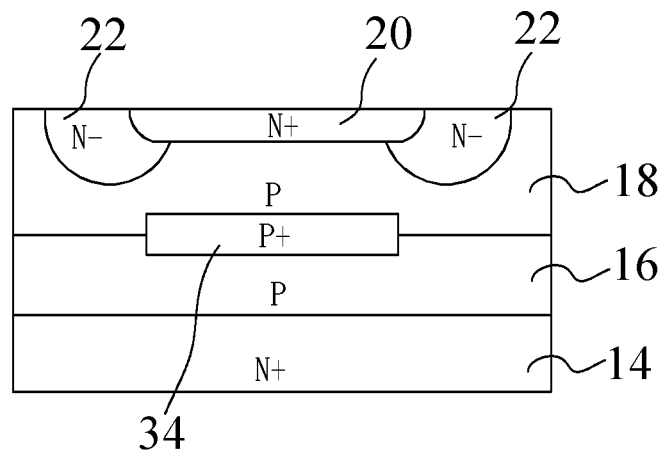
Figure 26C:
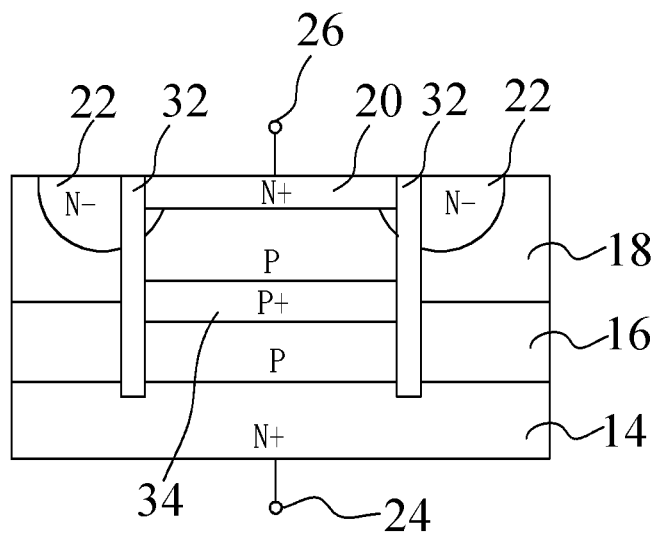

FIG. 25 is a cross-sectional view of a bidirectional ESD protection device according to the twelfth embodiment of the present invention. FIGS. 26(a)-26(c) are cross-sectional views of the steps for fabricating a bidirectional ESD protection device according to the twelfth embodiment of the present invention. The twelfth embodiment is different from the sixth embodiment in the conductivity types. The first conductivity type and the second conductivity type of the twelfth embodiment are respectively an N type and a P type, so that a vertical NPN bipolar junction transistor is formed. The other structures and the fabrication method of the twelfth embodiment have been described in the sixth embodiment so will not be reiterated.

In conclusion, the embodiments form the lightly-doped area to cover the corner of the heavily-doped area, thereby suppressing the current crowding effect and improving the ESD robustness.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A bidirectional electrostatic discharge (ESD) protection device comprising:
   a heavily-doped semiconductor substrate having a first conductivity type;
   a first semiconductor epitaxial layer, having a second conductivity type, the second conductivity type being opposite to the first conductivity type and being formed on the heavily-doped semiconductor substrate;
   a second semiconductor epitaxial layer, having the second conductivity type, formed on the first semiconductor epitaxial layer, wherein doping concentration of the first semiconductor epitaxial layer is different from doping concentration of the second semiconductor epitaxial layer;
   a heavily-doped area, having the first conductivity type, formed in the second semiconductor epitaxial layer; and
   a lightly-doped area, having the first conductivity type, formed in the second semiconductor epitaxial layer, wherein the lightly-doped area surrounds the heavily-doped area and covers a corner of the heavily-doped area, without covering a central area of the heavily-doped area, and thereby leaving a central area of the heavily-doped area in direct interfacing contact with the second semiconductor epitaxial layer;
   wherein a conductive pin is directly electrically connected to the heavily-doped area, and there being no second heavily-doped area of the second conductivity type being directly electrically connected to the conductive pin.

2. The bidirectional electrostatic discharge protection device according to claim 1, wherein a breakdown voltage of a junction between the heavily-doped semiconductor substrate and the first semiconductor epitaxial layer is substantially equal to a breakdown voltage of a junction between the second semiconductor epitaxial layer and the heavily-doped area.

3. The bidirectional electrostatic discharge protection device according to claim 1, wherein the first conductivity type is an N type and the second conductivity type is a P type.

4. The bidirectional electrostatic discharge protection device according to claim 1, wherein the first conductivity type is a P type and the second conductivity type is an N type.

5. The bidirectional electrostatic discharge protection device according to claim 1, wherein the doping concentration of the first semiconductor epitaxial layer is higher than the doping concentration of the second semiconductor epitaxial layer.

6. The bidirectional electrostatic discharge protection device according to claim 1, wherein an absolute value of the breakdown voltage of the junction between the heavily-doped semiconductor substrate and the first semiconductor epitaxial layer is equal to an absolute value of the breakdown voltage of the junction between the second semiconductor epitaxial layer and the heavily-doped area.

7. The bidirectional electrostatic discharge protection device according to claim 1, further comprising an isolation structure formed in the heavily-doped semiconductor substrate, the first semiconductor epitaxial layer, and the second semiconductor epitaxial layer, and the isolation structure surrounds the heavily-doped area and the lightly-doped area.

8. The bidirectional electrostatic discharge protection device according to claim 1, further comprising an isolation structure formed in the heavily-doped semiconductor substrate, the first semiconductor epitaxial layer, and the second semiconductor epitaxial layer, the isolation structure surrounds the heavily-doped area, and the lightly-doped area surrounds the isolation structure.

9. The isolation structure according to claim 7, wherein a depth of the isolation structure is at least deeper than a total thickness of the first semiconductor epitaxial layer and the second semiconductor epitaxial layer.

10. The isolation structure according to claim 8, a depth of the isolation structure is at least deeper than a total thickness of the first semiconductor epitaxial layer and the second semiconductor epitaxial layer.

11. The bidirectional electrostatic discharge protection device according to claim 1, further comprising a heavily-doped buried layer formed between the first semiconductor epitaxial layer and the second semiconductor epitaxial layer, and the heavily-doped buried layer has the second conductivity type.

12. The bidirectional electrostatic discharge protection device according to claim 1, wherein a bottom of the lightly-doped area is equal to or deeper than a bottom of the heavily-doped area.

13. The bidirectional electrostatic discharge protection device according to claim 1, wherein the heavily-doped semiconductor substrate is coupled to another conductive pin; and the first semiconductor epitaxial layer and the second semiconductor epitaxial layer are floating.

* * * * *